US006999016B2

United States Patent
Haga et al.

(10) Patent No.: US 6,999,016 B2
(45) Date of Patent: Feb. 14, 2006

(54) D/A CONVERTER AND SEMICONDUCTOR DEVICE

(75) Inventors: Akira Haga, Kawasaki (JP); Atsushi Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/864,349

(22) Filed: Jun. 10, 2004

(65) Prior Publication Data

US 2005/0168367 A1 Aug. 4, 2005

(30) Foreign Application Priority Data

Jan. 30, 2004 (JP) ............................ 2004-023116

(51) Int. Cl.
*H03M 1/66* (2006.01)

(52) U.S. Cl. ....................... 341/144; 341/145; 341/154

(58) Field of Classification Search ................ 341/144, 341/145, 118, 154, 120, 149, 126
See application file for complete search history.

(56) References Cited

U.S. PATENT DOCUMENTS 5,302,951 A * 4/1994 Yamashita .................. 341/144
5,568,146 A * 10/1996 Park ........................... 341/145
5,585,795 A * 12/1996 Yuasa et al. ................ 341/118
5,684,481 A * 11/1997 Ashe .......................... 341/139
6,486,818 B1 * 11/2002 Nicholson et al. .......... 341/154
6,549,154 B2 4/2003 Isobe et al.

* cited by examiner

*Primary Examiner*—John B Nguyen
(74) *Attorney, Agent, or Firm*—Arent Fox PLLC

(57) ABSTRACT

A D/A converter in which reference voltage around which voltages outputted vary is not generated by an amplifier in order to reduce electric current consumption. A resistor circuit divides power supply voltage and outputs a plurality of voltages which make up an arithmetic progression. A decoder circuit decodes a digital signal and outputs a control signal. A switching circuit is turned on/off in accordance with the control signal sent from the decoder circuit and selects and outputs one of the plurality of voltages outputted from the resistor circuit. In a conversion circuit, a voltage equal to half of the power supply voltage is obtained by dividing the power supply voltage by resistors and inputted to an inverting input terminal of an operational amplifier which forms a non-inverting amplifier, and the voltage inputted from a switching circuit to a non-inverting input terminal of the operational amplifier is converted into a voltage which varies around a voltage equal to half of the power supply voltage and the converted voltage is outputted. As a result, there is no need to use an amplifier for outputting the voltage equal to half of the power supply voltage and electric current consumption can be reduced.

4 Claims, 5 Drawing Sheets

D/A CONVERTER AND SEMICONDUCTOR DEVICE

CROSS-REFERENCE TO RELATED APPLICATIONS

This application is based upon and claims priority of Japanese Patent Application No. 2004-023116, filed on Jan. 30, 2004, the contents being incorporated herein by reference.

BACKGROUND OF THE INVENTION (1) Field of the Invention

This invention relates to a D/A converter and semiconductor device and, more particularly, to a D/A converter and semiconductor device for outputting analog voltages which correspond to digital values and which vary around half of power supply voltage.

(2) Description of the Related Art

With the progress of digital information processing, at present an analog quantity is converted into a digital quantity with an A/D converter to perform digital processing. On the other hand, a digital quantity obtained by digital processing is converted into an analog quantity with a D/A converter to control. A D/A converter may be used in an analog delayed locked loop (DLL) in a dynamic random access memory (DRAM) (see, for example, Japanese Unexamined Patent Publication No. 2002-305449, paragraph nos. [0023]–[0026] and FIG. 2).

FIG. 3 is a circuit diagram of a conventional 8-bit D/A converter.

As shown in FIG. 3, an 8-bit D/A converter comprises a resistor circuit 101, a switching circuit 102, a decoder circuit 103, a conversion circuit 104, and an amplifier 105.

The resistor circuit 101 includes resistors R101a, R101b, R101c, . . . , R101m, and R101n connected in series. The resistor R101a is grounded and the resistor R101m is connected to a power supply of Vdd. 256 voltages which make up an arithmetic progression are taken from the resistors connected in series in the resistor circuit 101.

The switching circuit 102 includes switches SW101a, SW101b, SW101c, . . . , SW101m. Voltage outputted from the resistor circuit 101 is inputted to one end of each of these switches. The other ends of these switches are connected to one another.

The decoder circuit 103 has 256 signal lines on the output side. These signal lines are connected to the switches, respectively, in the switching circuit 102 to control them so that they will be turned on/off. The 8-bit digital signal "D0, D1, . . . D6, D7" is inputted to the decoder circuit 103. The decoder circuit 103 decodes the digital signal inputted and outputs a signal to a signal line corresponding to the digital value of the digital signal. As a result, a voltage corresponding to the digital value will be outputted from the switching circuit 102.

The conversion circuit 104 converts the voltage which is outputted from the switching circuit 102 and which corresponds to the digital value into a voltage which varies around reference voltage and outputs it. The conversion circuit 104 includes an operational amplifier 104*a* and resistors R102 and R103.

The amplifier 105 outputs the reference voltage to the conversion circuit 104. The amplifier 105 outputs a voltage equal to half of Vdd to the conversion circuit 104 as the reference voltage. Therefore, the conversion circuit 104 can output voltages which vary around half of Vdd and which correspond to digital values. That is to say, the conversion circuit 104 can output voltages which correspond to digital values and which range from 0 V to Vdd.

The amplifier 105 outputs the voltage equal to half of Vdd generated by resistors to the conversion circuit 104 via a voltage follower.

FIG. 4 is a circuit diagram of the amplifier 105 shown in FIG. 3.

As shown in FIG. 4, the amplifier 105 includes resistors R104 and R105 and an operational amplifier 106.

The resistors R104 and R105 are connected in series. The resistor R105 is connected to the power supply of Vdd and the resistor R104 is grounded. A non-inverting input terminal of the operational amplifier 106 is connected to a point where the resistors R104 and R105 are connected. An inverting input terminal of the operational amplifier 106 is connected to the output side. The operational amplifier 106 forms the voltage follower.

If the resistance values of the resistors R104 and R105 are the same, then a voltage equal to half of the power supply voltage Vdd will be outputted from the operational amplifier 106.

Voltage outputted from the operational amplifier 104*a* shown in FIG. 3 will now be calculated from equations. The following equation (1) holds.

$$(Vo-Vi)/r\mathbf{103}=(Vi-1/2Vdd)/r\mathbf{102} \quad (1)$$

where Vi is voltage outputted from the switching circuit 102, Vo is voltage outputted from the operational amplifier 104*a*, r102 is the resistance value of the resistor R102, and r103 is the resistance value of the resistor R103.

By changing equation (1), the following equation (2) can be derived.

$$Vo-Vi=r\mathbf{103}/r\mathbf{102}(Vi-1/2Vdd)$$

$$Vo=(1+r\mathbf{103}/r\mathbf{102})(Vi-1/2Vdd)+1/2Vdd \quad (2)$$

As indicated by equation (2), voltage Vo outputted from the operational amplifier 104*a* varies around half of the power supply voltage Vdd.

Another example of conventional D/A converters will now be described.

FIG. 5 is a circuit diagram of another example of conventional D/A converters.

As shown in FIG. 5, a D/A converter comprises resistor circuits 111*a*, 111*b*, 111*c*, etc., switching circuits 112*a*, 112*b*, 112*c*, etc., decoder circuits 113*a*, 113*b*, 113*c*, etc., conversion circuits 114*a*, 114*b*, 114*c*, etc., and an amplifier 115.

The D/A converter shown in FIG. 5 includes a plurality of D/A converters each of which is the same as that shown in FIG. 3. That is to say, the D/A converter shown in FIG. 5 is a multichannel D/A converter in which a plurality of digital signals are converted into analog signals. In this case, a voltage equal to half of power supply voltage Vdd is also generated by the amplifier 115. The reference voltage generated by the amplifier 115 is inputted to the plurality of conversion circuits. As a result, voltages which correspond to digital values and which are outputted from the plurality of switching circuits will vary around the reference voltage.

SUMMARY OF THE INVENTION

In the present invention, a D/A converter for outputting analog voltages corresponding to digital values is provided. This D/A converter comprises a resistor circuit for dividing power supply voltage and for outputting a plurality of voltages which make up an arithmetic progression, a decoder circuit for decoding a digital signal and for outputting a control signal, a switching circuit turned on/off in accordance with the control signal for selecting and outputting one of the plurality of voltages, and a conversion circuit for converting the voltage inputted from said switching circuit to a non-inverting input terminal of an operational amplifier which forms a non-inverting amplifier into a voltage which varies around a voltage equal to half of the power supply voltage and for outputting the converted voltage, wherein the voltage equal to half of the power supply voltage is obtained by dividing the power supply voltage by resistors and inputted to an inverting input terminal of the operational amplifier.

In addition, in the present invention a semiconductor device for outputting analog voltages corresponding to digital values is provided. This semiconductor device comprises a resistor circuit for dividing power supply voltage and for outputting a plurality of voltages which make up an arithmetic progression, a decoder circuit for decoding a digital signal and for outputting a control signal, a switching circuit turned on/off in accordance with the control signal for selecting and outputting one of the plurality of voltages, and a conversion circuit for converting the voltage inputted from said switching circuit to a non-inverting input terminal of an operational amplifier which forms a non-inverting amplifier into a voltage which varies around a voltage equal to half of the power supply voltage and for outputting the converted voltage, wherein the voltage equal to half of the power supply voltage is obtained by dividing the power supply voltage by resistors and inputted to an inverting input terminal of the operational amplifier.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENTS

With each D/A converter described in "Description of the Related Art," the reference voltage around which voltages outputted vary is generated by the amplifier. Therefore, current flows in the amplifier, resulting in high current consumption.

The present invention was made to solve such a problem. An object of the present invention is to provide a D/A converter and semiconductor device in which reference voltage around which voltages outputted vary is not generated by an amplifier for the purpose of reducing electric current consumption.

A first embodiment of the present invention will now be described in detail with reference to a drawing.

Figure 1:
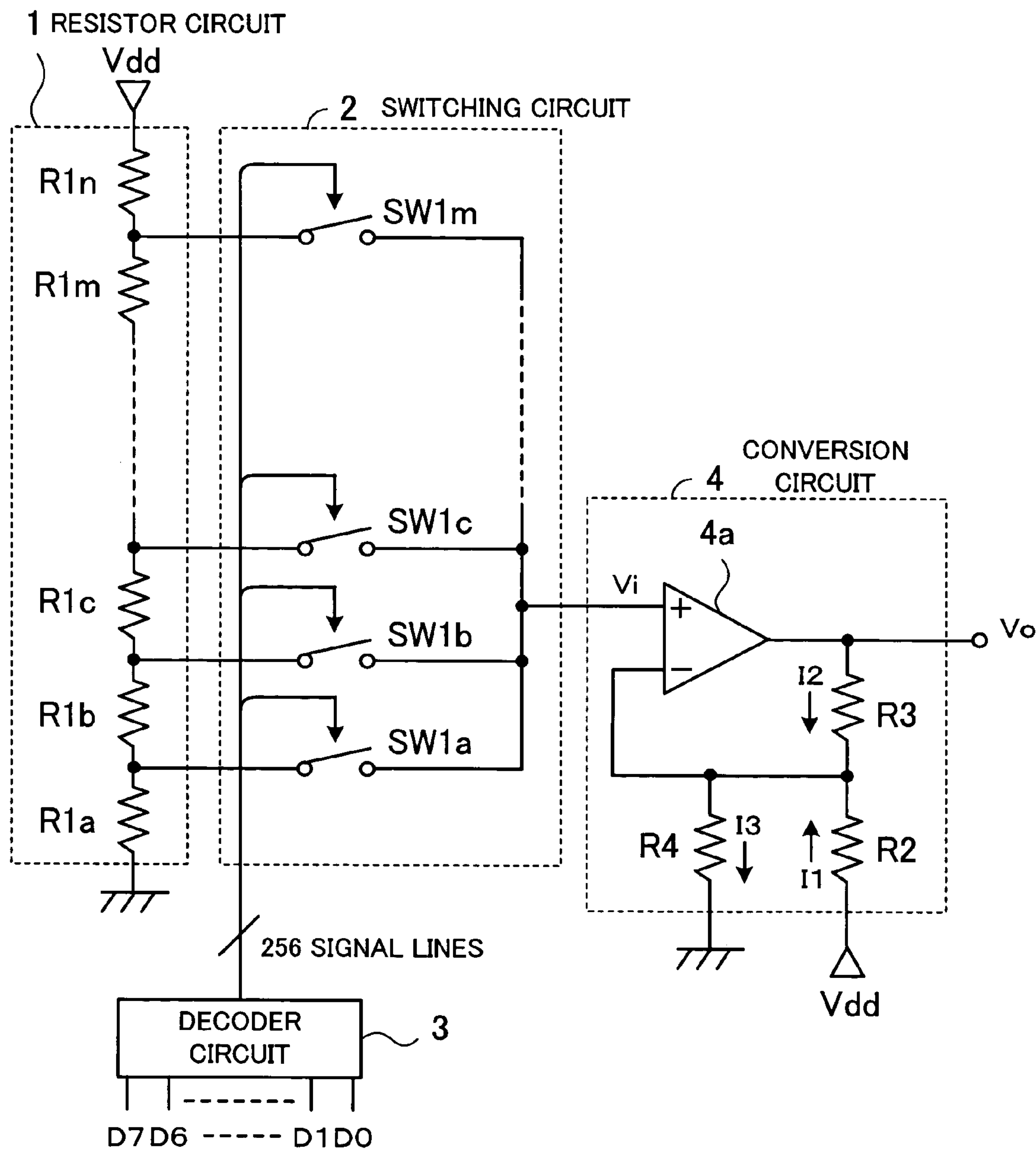
FIG. 1 is a circuit diagram of a D/A converter according to a first embodiment of the present invention.

FIG. 1 is a circuit diagram of a D/A converter according to a first embodiment of the present invention.

Description will be given with an 8-bit D/A converter as an example. A D/A converter shown in FIG. 1 will be formed on a semiconductor chip in a semiconductor device. The D/A converter comprises a resistor circuit 1, a switching circuit 2, a decoder circuit 3, and a conversion circuit 4.

The resistor circuit 1 includes 257 resistors R1a, R1b, R1c, . . . , R1m, and R1n connected in series. A terminal of the resistor R1a which is not connected to the resistor R1b is grounded. A terminal of the resistor R1n which is not connected to the resistor R1m is connected to power supply of Vdd. 256 voltages are taken from the resistors connected in series in the resistor circuit 1.

The resistance value of each resistor in the resistor circuit 1 is the same. Therefore, the plurality of voltage values taken from the resistor circuit 1 make up an arithmetic progression.

The switching circuit 2 includes switches SW1a, Sw1b, SW1c, . . . , and SW1m. Voltage outputted from the resistor circuit 1 is inputted to one end of each of the switches SW1a, SW1b, SW1c, . . . , and SW1m. The other ends of these switches are connected to one another. Accordingly, when one of the switches SW1a, SW1b, SW1c, . . . , and SW1m is closed, voltage inputted to one end of the switch is outputted from the other end of the switch.

The decoder circuit 3 has 256 signal lines on the output side. These signal lines are connected to the switches SW1a, SW1b, SW1c, . . . , and SW1m, respectively, in the switching circuit 2 to control them so that they will be turned on/off. The 8-bit digital signal "D0 D1 . . . D6 D7" to be converted into an analog signal is inputted to the decoder circuit 3. The decoder circuit 3 decodes the digital signal inputted and outputs a signal to a signal line corresponding to the digital value of the digital signal. At this time the decoder circuit 3 outputs a signal to a signal line connected to one of the switches SW1a, SW1b, SW1c, . . . , and SW1m so that the switching circuit 2 will output a voltage corresponding to the digital value. It is assumed that the 8-bit digital value "00000000" is inputted to the decoder circuit 3. Then the decoder circuit 3 outputs a signal to a signal line so that the switch SW1a in the switching circuit 2 will be closed. It is assumed that the 8-bit digital value "11111111" is inputted to the decoder circuit 3. Then the decoder circuit 3 outputs a signal to a signal line so that the switch SW1*m* in the switching circuit 2 will be closed.

In this example, the 8-bit digital signal is used. However, there is no limit on the number of bits included in the digital signal. The number of the signal lines, the number of the resistors included in the resistor circuit 1, and the number of the switches included in the switching circuit 2 will vary according to the number of bits included in the digital signal.

The conversion circuit 4 converts the voltage which is outputted from the switching circuit 2 and which corresponds to the digital value into a voltage which varies around reference voltage and outputs it. The reference voltage is half of the power supply voltage Vdd. By setting the reference voltage to half of the power supply voltage Vdd, the conversion circuit 4 can output voltages which correspond to digital values and which range from 0 V to Vdd.

The conversion circuit 4 includes an operational amplifier 4*a* and resistors R2 through R4. A non-inverting input terminal of the operational amplifier 4*a* is connected to the other ends of the switches SW1a, SW1b, SW1c, . . . , and SW1m in the switching circuit 2. One end of each of the resistors R2 through R4 is connected to an inverting input terminal of the operational amplifier 4*a*. The other end of the resistor R2 is connected to the power supply and the voltage Vdd is applied thereto. The other end of the resistor R3 is connected to the output side of the operational amplifier 4*a*. The other end of the resistor R4 is grounded.

The operational amplifier 4*a* forms a non-inverting amplifier by the resistors R3 and R4. Voltage obtained by dividing the power supply voltage Vdd by the resistors R2 and R4 is inputted to the inverting input terminal of the operational amplifier 4*a*. Accordingly, the operational amplifier 4*a* converts the voltage inputted to the non-inverting input terminal into a voltage which varies around the voltage inputted to the inverting input terminal and outputs it. If the resistance values of the resistors R2 and R4 are the same, then the operational amplifier 4*a* will convert the voltage inputted to the non-inverting input terminal into a voltage which varies around half of the power supply voltage Vdd and outputs it.

Voltage outputted from the operational amplifier 4*a* will now be calculated from equations. The following equations (3) through (6) hold.

$$I3=I1+I2 \quad (3)$$

$$I1=(Vdd-Vi)/r2 \quad (4)$$

$$I2=(Vo-Vi)/r3 \quad (5)$$

$$I3=Vi/r4 \quad (6)$$

where Vi is voltage inputted to the operational amplifier 4*a*, Vo is voltage outputted from the operational amplifier 4*a*, r2 is the resistance value of the resistor R2, r3 is the resistance value of the resistor R3, r4 is the resistance value of the resistor R4, I1 is an electric current which flows through the resistor R2, I2 is an electric current which flows through the resistor R3, and I3 is an electric current which flows through the resistor R4.

The following equation (7) is derived by substituting equation (6) in equations (3) through (5).

$$(Vdd-Vi)/r2+(Vo-Vi)/r3=Vi/r4 \quad (7)$$

In equation (7), if the values of r2 and r4 are the same, that is to say, if the resistance values of the resistors R2 and R4 are the same, then the following equation (8) is derived.

$$Vo=(2r3/r2+1)\times(Vi-1/2Vdd)+1/2Vdd \quad (8)$$

If r3 in equation (8) equals r2/2, that is to say, if the resistance value of the resistor R3 equals half of the resistance value of the resistor R2, then equation (8) is the same as equation (2). Therefore, the voltage Vo outputted from the operational amplifier 4*a* varies around half of the power supply voltage Vdd without reference voltage generated by an amplifier.

Operation performed in FIG. 1 will now be described.

When the digital signal is inputted, the decoder circuit 3 outputs a signal to a signal line connected to one of the switches SW1*a*, SW1*b*, SW1*c*, . . . , and SW1*m* so that the switching circuit 2 will output a voltage corresponding to the digital value of the digital signal.

When one of the switches SW1*a*, SW1*b*, SW1*c*, . . . , and SW1*m* is closed under the control of the decoder circuit 3, the switching circuit 2 outputs voltage outputted from the resistor circuit 1 to the conversion circuit 4.

The conversion circuit 4 converts the voltage outputted from the switching circuit 2 into a voltage which varies around half of the power supply voltage Vdd and outputs it. There is no need to input reference voltage generated by an amplifier to the conversion circuit 4.

As stated above, a voltage which equals half of the power supply voltage Vdd and which is obtained by dividing the power supply voltage Vdd by the resistors is inputted to the inverting input terminal of the operational amplifier 4*a* in the conversion circuit 4 which forms a non-inverting amplifier and the voltage Vo varies around half of the power supply voltage Vdd. This makes it unnecessary to use an amplifier for outputting the voltage equal to half of the power supply voltage Vdd and therefore reduces electric current consumption. In addition, an amplifier is unnecessary, so the area of the circuits can be reduced.

Figure 3:
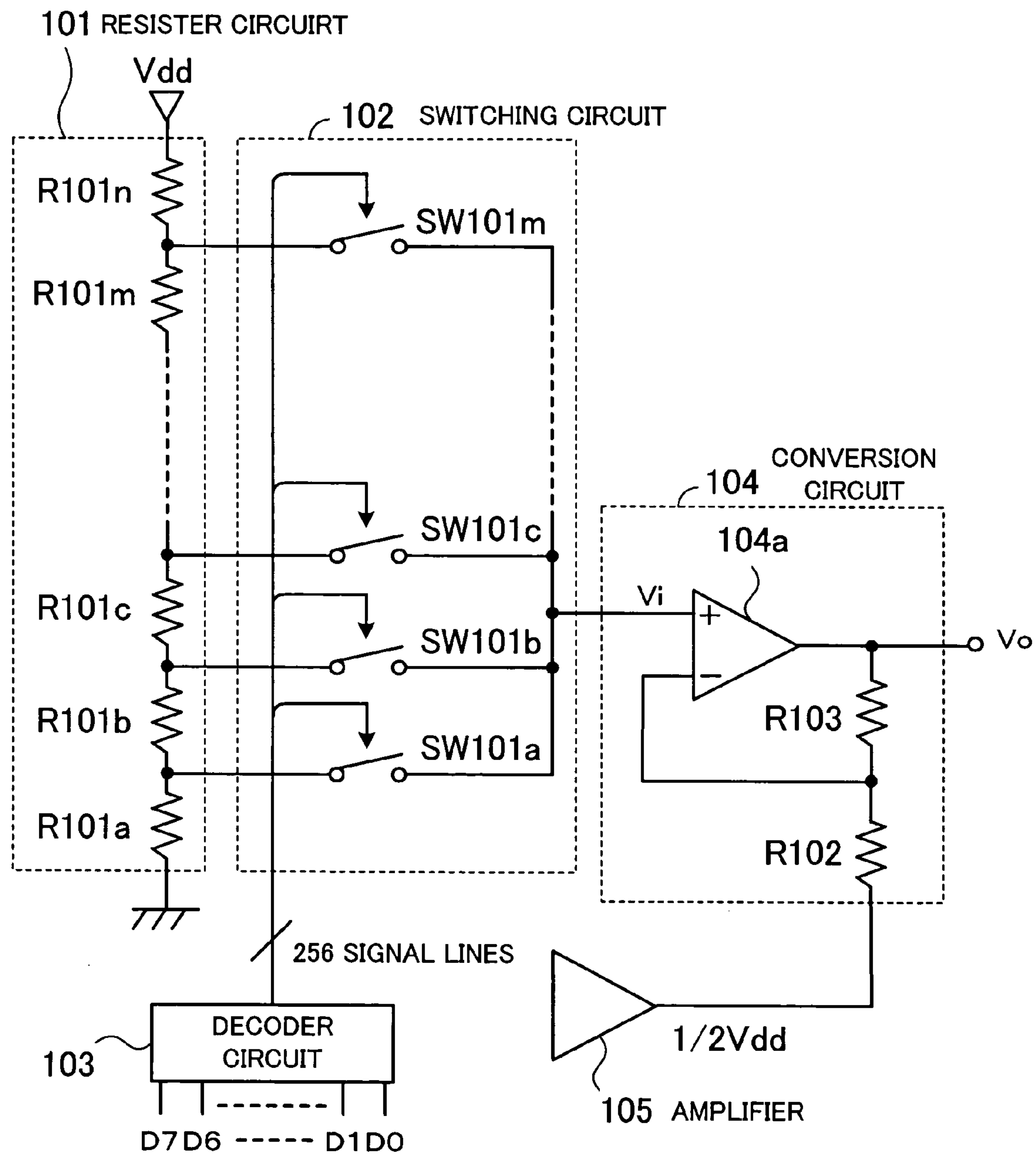
FIG. 3 is a circuit diagram of a conventional 8-bit D/A converter.
Figure 4:
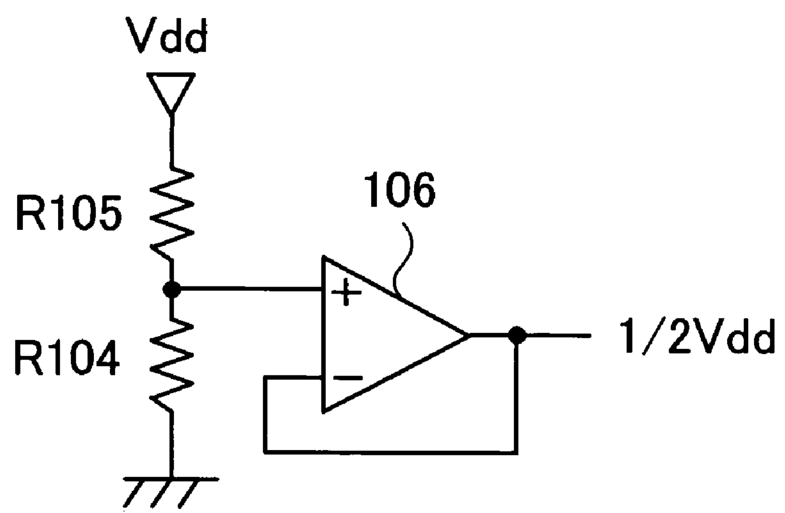
FIG. 4 is a circuit diagram of the amplifier shown in FIG. 3.
Figure 5:
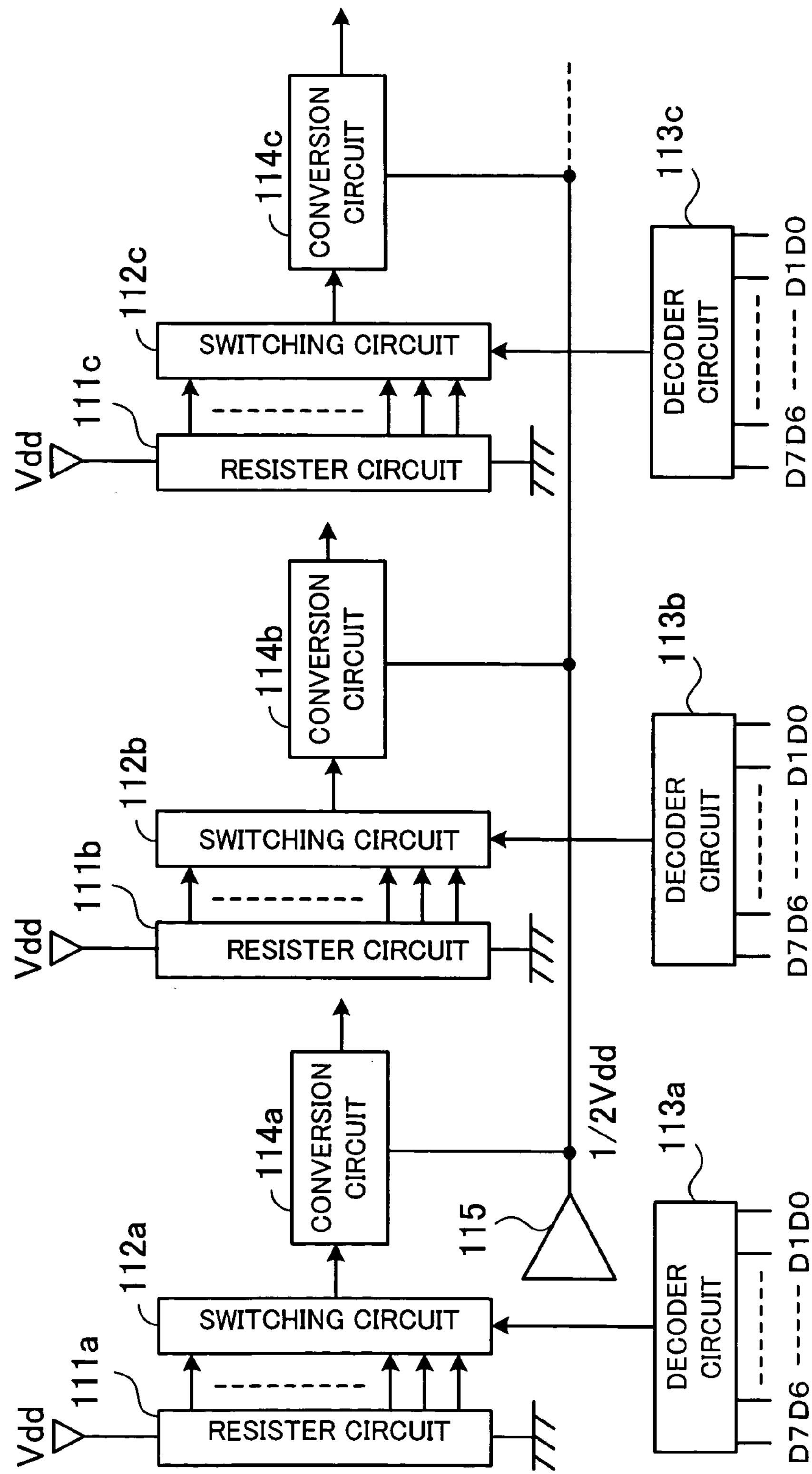
FIG. 5 is a circuit diagram of another example of conventional D/A converters.

Electric current consumption by the D/A converter according to the first embodiment of the present invention is lower by 40 to 50% than electric current consumption by the circuits shown in FIG. 3 and the area of the circuits in the D/A converter according to the first embodiment of the present invention is smaller by 20% than the area of the circuits shown in FIG. 3. However, these values will change according to the number of bits included in a digital value to be converted into an analog value.

A second embodiment of the present invention will now be described in detail with reference to a drawing.

Figure 2:
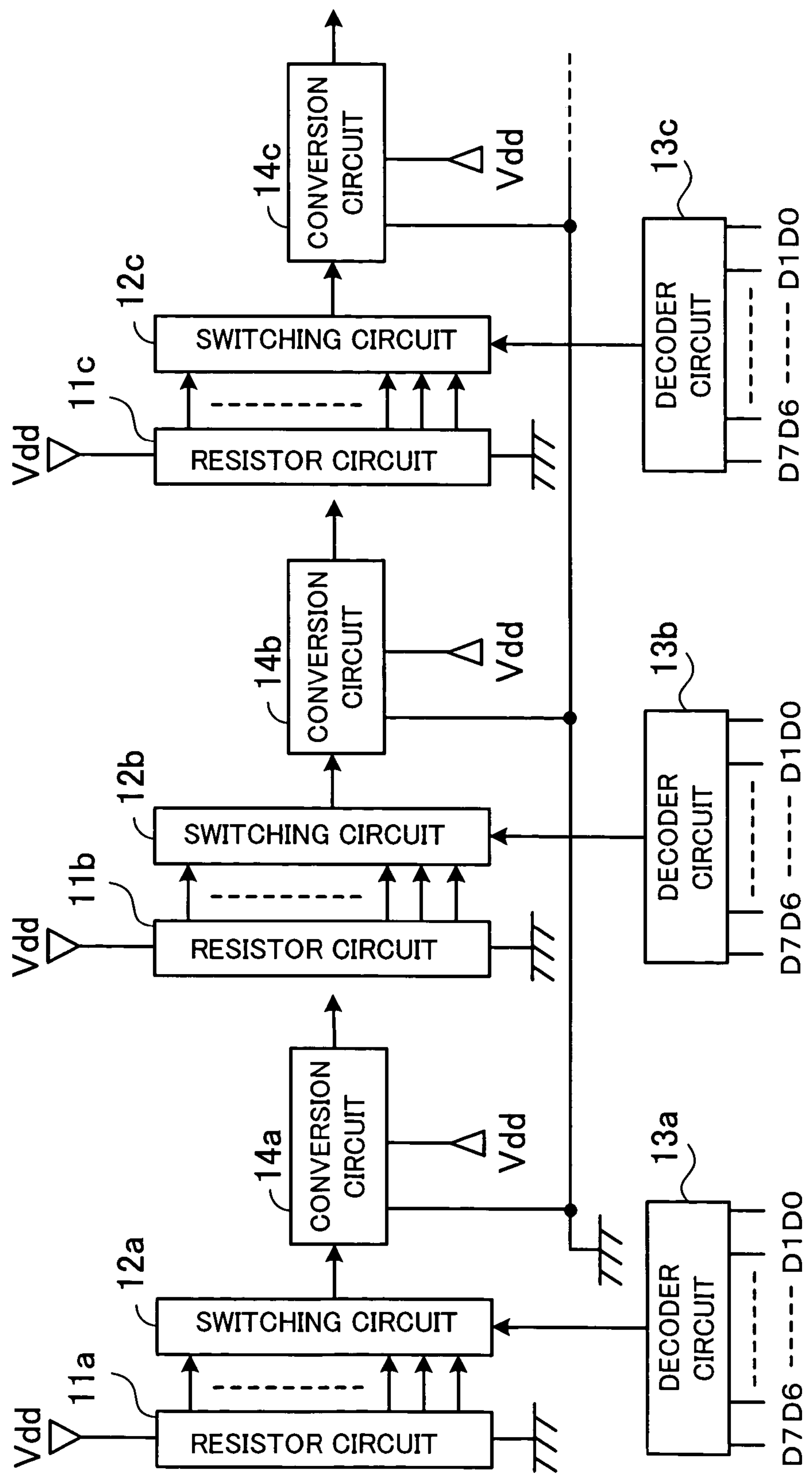
FIG. 2 is a circuit diagram of a D/A converter according to a second embodiment of the present invention.

FIG. 2 is a circuit diagram of a D/A converter according to a second embodiment of the present invention.

A D/A converter shown in FIG. 2 will be formed on a semiconductor chip in a semiconductor device. The D/A converter comprises resistor circuits 11*a*, 11*b*, 11*c*, etc., switching circuits 12*a*, 12*b*, 12*c*, etc., decoder circuits 13*a*, 13*b*, 13*c*, etc., and conversion circuits 14*a*, 14*b*, 14*c*, etc.

The D/A converter shown in FIG. 2 includes a plurality of D/A converters each of which is the same as that shown in FIG. 1. That is to say, the D/A converter shown in FIG. 2 is a multichannel D/A converter for converting a plurality of digital values into analog ones. The structure of each of the resistor circuits 11*a*, 11*b*, 11*c*, etc. is the same as that of the resistor circuit 1 shown in FIG. 1. The structure of each of the switching circuits 12*a*, 12*b*, 12*c*, etc. is the same as that of the switching circuit 2 shown in FIG. 1. The structure of each of the decoder circuits 13*a*, 13*b*, 13*c*, etc. is the same as that of the decoder circuit 3 shown in FIG. 1. The structure of each of the conversion circuits 14*a*, 14*b*, 14*c*, etc. is the same as that of the conversion circuit 4 shown in FIG. 1.

Each of the resistor circuits 11*a*, 11*b*, 11*c*, etc. includes a plurality of resistors connected in series between power supply and a ground. Each of the resistor circuits 11*a*, 11*b*, 11*c*, etc. divides the power supply voltage Vdd and outputs a plurality of voltages which make up an arithmetic progression.

The switching circuits 12*a*, 12*b*, 12*c*, etc. are connected to a plurality of signal lines which extend from the decoder circuits 13*a*, 13*b*, 13*c*, etc. respectively. The switching circuit 12*a* outputs one of the plurality of voltages outputted from the resistor circuit 11*a* to the conversion circuit 14*a* in response to a signal outputted to a signal line. The same applies to the switching circuits 12*b*, 12*c*, etc.

Each of the decoder circuits 13*a*, 13*b*, 13*c*, etc. decodes the digital signal "D0 D1 . . . D6 D7" inputted and outputs a signal to a signal line corresponding to the digital value of the digital signal. As a result, a voltage corresponding to the digital value will be outputted from each of the switching circuit 12*a*, 12*b*, 12*c*, etc.

The conversion circuit 14*a* converts the voltage which is outputted from the switching circuit 12*a* and which corresponds to the digital value into a voltage which varies around reference voltage and outputs it. The reference voltage is half of the power supply voltage Vdd. By setting the reference voltage to half of the power supply voltage Vdd, the conversion circuit 14*a* can output voltages which correspond to digital values and which range from 0 V to Vdd. The same applies to the conversion circuits 14*b*, 14*c*, etc.

As described above, the structure of each of the conversion circuits 14*a*, 14*b*, 14*c*, etc. is the same as that of the conversion circuit 4 shown in FIG. 1. Therefore, there is no need to input reference voltage generated by an amplifier to each of the conversion circuits 14*a*, 14*b*, 14*c*, etc.

As stated above, a voltage which equals half of the power supply voltage Vdd and which is obtained by dividing the power supply voltage Vdd by resistors is inputted to an inverting input terminal of an operational amplifier in each of the conversion circuits 14*a*, 14*b*, 14*c*, etc. which forms a non-inverting amplifier and the voltage corresponding to the digital value varies around half of the power supply voltage Vdd. This makes it unnecessary to use an amplifier for outputting the voltage equal to half of the power supply voltage Vdd and therefore reduces electric current consumption. In addition, an amplifier is unnecessary, so the area of the circuits can be reduced.

Electric current consumption by the D/A converter according to the second embodiment of the present invention is lower by 40 to 50% than electric current consumption by the circuits shown in FIG. 3 and the area of the circuits in the D/A converter according to the second embodiment of the present invention is smaller by 20% than the area of the circuits shown in FIG. 3. However, these values will change according to the number of bits included in a digital value to be converted into an analog value.

With the D/A converters according to the present invention, a voltage which equals half of the power supply voltage and which is obtained by dividing the power supply voltage by the resistors is inputted to the inverting input terminal of the operational amplifier in the conversion circuit which forms a non-inverting amplifier and voltage outputted from the operational amplifier varies around half of the power supply voltage. This makes it unnecessary to use an amplifier for outputting the voltage equal to half of the power supply voltage and therefore reduces electric current consumption.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A D/A converter for outputting analog voltages corresponding to digital values, the converter comprising:

a resistor circuit for dividing power supply voltage and for outputting a plurality of voltages which make up an arithmetic progression;

a decoder circuit for decoding a digital signal and for outputting a control signal;

a switching circuit turned on/off in accordance with the control signal for selecting and outputting one of the plurality of voltages; and a conversion circuit for converting the voltage inputted from said switching circuit to a non-inverting input terminal of an operational amplifier which forms a non-inverting amplifier into a voltage which varies around a voltage equal to half of the power supply voltage and for outputting the converted voltage, wherein the voltage equal to half of the power supply voltage is obtained by dividing the power supply voltage by resistors and inputted to an inverting input terminal of the operational amplifier;

wherein the resistors comprise a first resistor, a second resistor and a third resistor, wherein one end of the first resistor, one end of the second resistor, and one end of the third resistor having the same resistance value as the first resistor are connected to the inverting input terminal of the operational amplifier; and the other end of the first resistor is connected to power supply which outputs the power supply voltage, the other end of the second resistor is connected to an output side of the operational amplifier, and the other end of the third resistor is connected to a ground.

2. The D/A converter according to claim 1, wherein the resistor circuit includes a plurality of resistors connected in series between the power supply which outputs the power supply voltage and the ground and the voltage is outputted from between adjacent two resistors of the plurality of resistors.

3. The D/A converter according to claim 1, wherein the switching circuit includes switches which correspond to the plurality of voltages outputted from the resistor circuit and which are turned on/off in accordance with the control signal.

4. A semiconductor device for outputting analog voltages corresponding to digital values, the device comprising:

a resistor circuit for dividing power supply voltage and for outputting a plurality of voltages which make up an arithmetic progression;

a decoder circuit for decoding a digital signal and for outputting a control signal;

a switching circuit turned on/off in accordance with the control signal for selecting and outputting one of the plurality of voltages; and a conversion circuit for converting the voltage inputted from said switching circuit to a non-inverting input terminal of an operational amplifier which forms a non-inverting amplifier into a voltage which varies around a voltage equal to half of the power supply voltage and for outputting the converted voltage, wherein the voltage equal to half of the power supply voltage is obtained by dividing the power supply voltage by resistors and inputted to an inverting input terminal of the operational amplifier;

wherein the resistors comprise a first resistor, a second resistor and a third resistor, wherein one end of the first resistor, one end of the second resistor, and one end of the third resistor having the same resistance value as the first resistor are connected to the inverting input terminal of the operational amplifier; and the other end of the first resistor is connected to power supply which outputs the power supply voltage, the other end of the second resistor is connected to an output side of the operational amplifier, and the other end of the third resistor is connected to a ground.

* * * * *